(12) United States Patent
Chen

(10) Patent No.: US 6,892,007 B2
(45) Date of Patent: May 10, 2005

(54) MONITORING OPTICAL TRANSMITTER SIGNALS

(75) Inventor: Ye Christine Chen, San Jose, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 131 days.

(21) Appl. No.: 10/244,565

(22) Filed: Sep. 16, 2002

(65) Prior Publication Data
US 2004/0052463 A1 Mar. 18, 2004

(51) Int. Cl.[7] ................................................. G02B 6/26
(52) U.S. Cl. ............................. 385/48; 385/88; 385/14; 385/89
(58) Field of Search ............................. 385/14, 24, 31, 385/37, 48, 88, 89, 92, 94

(56) References Cited

U.S. PATENT DOCUMENTS

| | | |
|---|---|---|
| 5,513,021 A | 4/1996 | Kaneshiro et al. |
| 5,923,796 A | 7/1999 | Feldman et al. |
| 6,343,171 B1 | 1/2002 | Yoshimura et al. |
| 6,571,033 B2 * | 5/2003 | Caracci et al. ................ 385/24 |
| 2002/0075911 A1 | 6/2002 | Cham et al. |

* cited by examiner

Primary Examiner—Akm Enayet Ullah
Assistant Examiner—Kevin S. Wood

(57) ABSTRACT

Systems and methods of monitoring optical transmitter signals are described. In one aspect, an optical transmitter system includes a feedback block, an optical substrate, a source of input light within an operative wavelength range, and a detector. The feedback block is substantially transparent to light within the operative wavelength range and includes an optical fiber side having a light output and one or more reflectors, and an optical substrate side. The optical substrate is substantially transparent to light within the operative wavelength range. The optical substrate includes a device side having a light input, and a feedback block side that is coupled to the optical substrate side of the feedback block. The feedback block side has a splitter that is operable to split light that is received from the device side light input into an output beam that is directed toward the light output of the feedback block and a light sample that is directed toward a feedback block reflector. The source of input light is mounted to the device side of the optical substrate and is aligned for light transmission through the device side light input to the splitter. The detector is mounted to the device side of the optical substrate and is aligned for detection of a light sample that is transmitted from a feedback block reflector and through the feedback block and the optical substrate.

21 Claims, 3 Drawing Sheets

MONITORING OPTICAL TRANSMITTER SIGNALS

CROSS-REFERENCE TO RELATED APPLICATIONS

This application relates to U.S. patent application Ser. No. 09/738,417, filed Dec. 15, 2000, by Kit M. Cham et al., and entitled "Integrated Parallel Channel Optical Monitoring for Parallel Optics Transmitter," which is incorporated herein by reference.

TECHNICAL FIELD

This invention relates to systems and methods of monitoring optical transmitter signals.

BACKGROUND

At a certain input current above a threshold level, a laser diode changes from a light emitting diode (LED) mode of operation into a laser mode of operation. In the LED operation mode, the laser diode emits incoherent light that diffuses rapidly. The LED operation mode cannot be used for data transmissions over long distances because optical power is lost too quickly. In the laser operation mode, however, the emitted laser light narrows into a coherent beam of light that can be transmitted over long distances with relatively little power loss. Diodes within the same class or family generally have threshold current levels that vary within a relatively narrow range. The threshold current level of a particular laser diode in a given class, however, may vary significantly with temperature. Threshold current levels also may change significantly with the age of a laser diode.

In many applications, the optical power output from a laser diode must be tightly controlled. The high end of laser output power typically is limited by eye safety considerations, laser reliability and receiver saturation levels, whereas the low end of laser output power typically is constrained by the speed performance of the laser source and the link budget. Thus, there typically is only a narrow band of optical power output levels at which a laser may operate to achieve satisfactory safety and performance specifications. However, over time the aging effect may change the delicately set laser power level to extend beyond the prescribed power limits, at which point the laser source must be replaced. To avoid this problem, the optical power output of a laser diode typically is monitored and the input current to the laser diode typically is adjusted in order to achieve a specified output power that satisfies both data transmission and safety requirements. Typically, laser output power is monitored by a photodetector that converts laser optical power into an electrical feedback signal that is transmitted to a feedback control system, which adjusts the laser output power to the specified output power level.

Different approaches have been proposed for monitoring the optical power output from a laser array. In some of these approaches, the optical power output from one or more lasers in the array is monitored. The monitored lasers are used as representative lasers in the array and are not used for data transmission. In another approach, U.S. patent Publication No. 2002/00759A1 describes an arrangement in which every laser diode in a parallel channel laser array is monitored to ensure that every diode is operating at its target level. In this approach, a diffractive optical arrangement in each channel splits off samples of the laser output. The laser output samples are reflected from one or more reflective regions toward a detector that monitors the output power of the samples. A feedback circuit adjusts each laser based on the signals that are generated by the detector. In this approach, the laser array and the diffractive optical arrangement are aligned by alignment pins and held spaced-apart within a transmitter package assembly.

SUMMARY

In one aspect of the invention, an optical transmitter system includes a feedback block, an optical substrate, a source of input light within an operative wavelength range, and a detector. The feedback block is substantially transparent to light within the operative wavelength range and includes an optical fiber side having a light output and one or more reflectors, and an optical substrate side. The optical substrate is substantially transparent to light within the operative wavelength range. The optical substrate includes a device side having a light input, and a feedback block side that is coupled to the optical substrate side of the feedback block. The feedback block side has a splitter that is operable to split light that is received from the device side light input into an output beam that is directed toward the light output of the feedback block and a light sample that is directed toward a feedback block reflector. The source of input light is mounted to the device side of the optical substrate and is aligned for light transmission through the device side light input to the splitter. The detector is mounted to the device side of the optical substrate and is aligned for detection of a light sample that is transmitted from a feedback block reflector and through the feedback block and the optical substrate.

The invention also features an optical transmitter monitoring method and a method of making an optical transmitter system.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
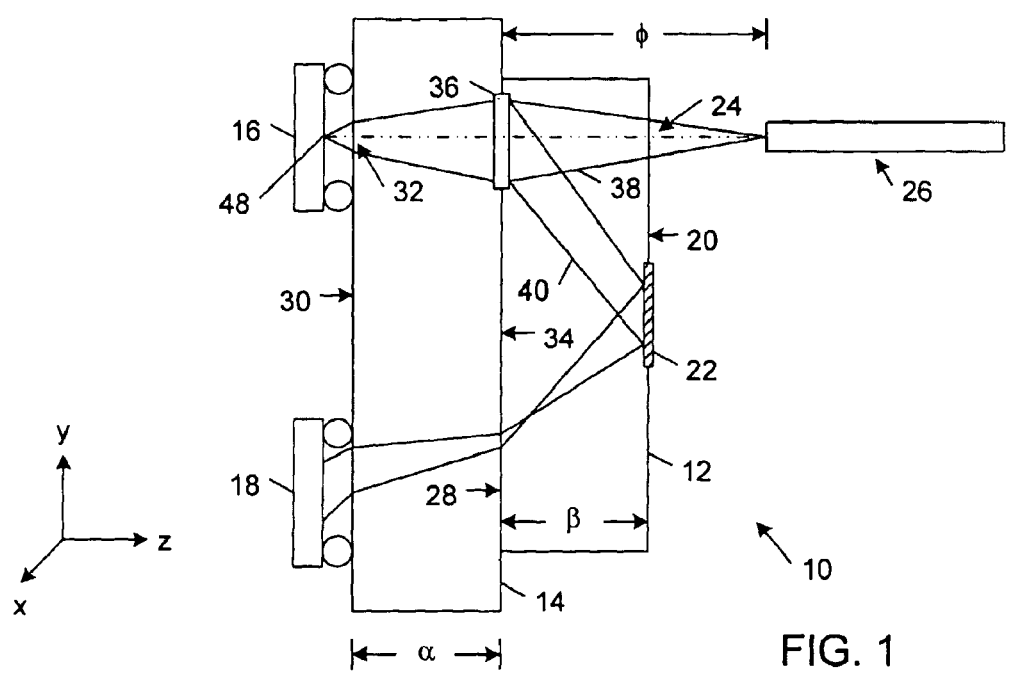
FIG. 1 is diagrammatic cross-sectional side view of an optical transmitter system that includes a feedback block, an optical substrate, a source of input light, and a detector.
Figure 2:
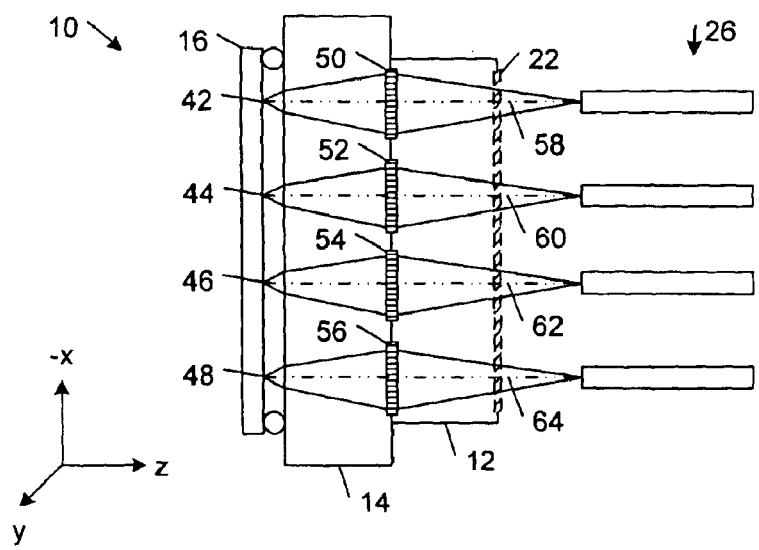
FIG. 2 is a diagrammatic cross-sectional top view of the optical transmitter system of FIG. 1.

Referring to FIGS. 1 and 2, in one embodiment, an optical transmitter system 10 includes a feedback block 12, an optical substrate 14, an input light source 16, and a detector 18.

Feedback block 12 includes an optical fiber side 20, which has a reflector 22 and a light output 24 that may be aligned with one or more optical fibers 26, and an optical substrate side 28, which is coupled to the optical substrate 14. To minimize back reflection of outbound light, the surface of light output 24 may include an antireflective coating (not shown). Optical substrate side 28 may be coupled to the optical substrate 14 using any one of a wide variety of known substrate bonding techniques, including an adhesive bonding process, a metal-to-metal bonding process, a glass seal bonding process, and a wafer bonding process. Feedback block 12 is substantially transparent to light within an operative wavelength range that, in general, includes the wavelength of light transmitted from optical source 16. In some embodiments, the operative wavelength range is 850 nm (nanometers) to 1600 nm. In other embodiments, the operative wavelength range is 1270 nm to 1600 nm. Reflector 22 is substantially reflective of light within the operative wavelength range and may be any one of a wide variety of different reflectors, including a reflective metal (e.g., aluminum or gold) film or a reflective dielectric mirror stack.

Optical substrate 14 includes a device side 30, which has a light input 32, and a feedback block side 34, which is coupled to the feedback block 12. Feedback block side 34 also has a splitter 36 that is operable to split light that is received from the light input 32 into an output beam 38, which is directed toward the light output 24 of feedback block 12, and a light sample 40, which is directed toward reflector 22. Light sample 40 may correspond to about 1–10% of the total optical power of an input light beam that is transmitted by light source 16. Optical substrate 14 is substantially transparent to light within the operative wavelength range. In the illustrated embodiment, optical substrate 14 has a higher refractive index tha feedback block 12. Optical substrate 14 also preferably is thermally-matched with feedback block 12.

Source 16 is mounted to the device side 30 of optical substrate 14 in alignment for light transmission through the light input 32 of the optical substrate 14 to splitter 36. In the illustrated embodiment, source 16 is mounted to optical substrate 14 by a flip-chip bonding process. In other embodiments, source 16 may be mounted to optical substrate 14 by other precision alignment bonding techniques, including solder reflow bonding techniques. In general, source 16 may include one or more light sources. In the illustrated embodiment, source 16 includes a 4-channel parallel array of semiconductor lasers 42, 44, 46, 48 (e.g., edge emitting lasers, folded cavity lasers, and vertical cavity surface emitting lasers). As shown in FIG. 2, each laser 42–48 of source 16 is precision-aligned with a respective optical splitting element 50, 52, 54, 56 of splitter 36 along a respective optical axis 58, 60, 62, 64. In general, each optical splitting element 50–56 is operable to direct each output beam and light sample pair along different respective beam paths.

Figure 3:
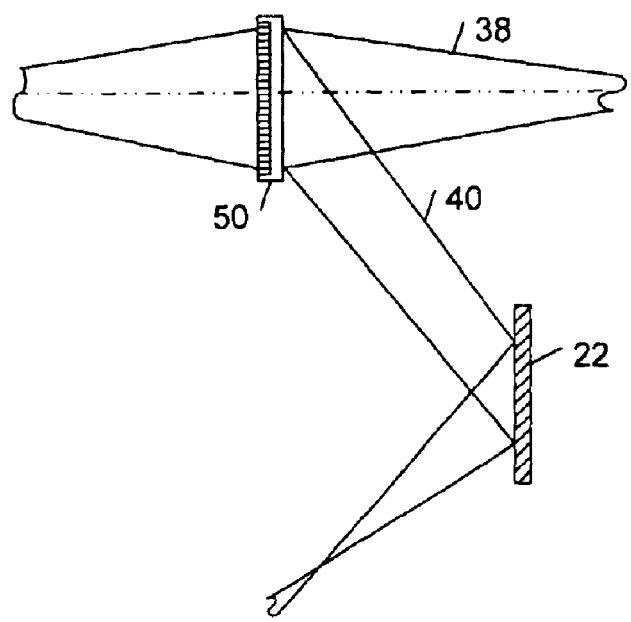
FIG. 3 is a diagrammatic cross-sectional side view of a diffractive lens splitting and focusing an input light beam.

Referring to FIG. 3, in the illustrated embodiment, each optical splitting element 50–56 may be implemented as a diffractive optical element (e.g., a computer generated hologram (CGH) or a grating) that is operable to pass the output beam 38 and to diffract the light sample 40. In other embodiments, each optical splitting element 50–56 may be operable to pass the light sample 40 and to diffract the output beam 38. In the illustrated embodiment, the diffractive optical elements are operable to focus the output beams onto the inputs of the optical fibers 26 with numerical apertures that match the acceptance angles of the corresponding optical fiber inputs. In some embodiments, splitter 36 is operable to collimate the output beams and the light samples; an additional focusing lens then is used to focus the collimated output beams onto the inputs of optical fibers 26.

Referring back to FIG. 1, in general, the thickness ($\alpha$) of optical substrate 14, the thickness ($\beta$) of feedback block 12, and the distance ($\phi$) between splitter 36 and the input end of optical fiber 26 depends on the beam spread at the source 16 and the indices of refraction for the optical substrate 14 and the feedback block 12 at the operative wavelength. In one illustrative embodiment, optical substrate 14 is formed of silicon and feedback block 12 is formed of glass (e.g., borosilicate glass, which is thermally-matched with silicon). In one embodiment, feedback block 12 is formed of BK7 borosilicate crown glass with a coefficient of thermal expansion of about 7.1 and high optical transmittance down to about 350 nm (available from Schott Glass Technologies Inc. of Duryea, Pa., U.S.A.)). In one implementation of this embodiment, the silicon optical substrate 14 may have a thickness ($\alpha$) that is on the order of about 0.675 mm and feedback block 12 may have a thickness ($\beta$) that is on the order of about 1 mm. In this embodiment, the distance ($\phi$) separating splitter 36 and the input end of optical fiber 26 may be on the order of about 1.3 mm.

By placing the splitter and the reflective optics on different structures, the above-described embodiments decouple the monitoring optics from the main transmission optics. In this way, the constraints imposed by the monitoring optics (e.g., sufficient distance from the splitter and the reflective optics to resolve output beam 38 from light sample 40) and the constraints imposed by the main transmission optics (e.g., practical spatial grating frequency for implementations in which the splitter includes diffractive optical elements for collimating or focusing the output beams onto optical fibers 26) may be optimized independently. In addition, these embodiments enable the source and the detector to be aligned precisely with the splitter using, for example, precision alignment bonding techniques, while relaxing the alignment tolerances between the feedback block and the optical substrate.

In embodiments in which the optical splitting elements are CGHs, each CGH has a numerically optimized design that provides the desired diffraction-inducing configuration of surface relief. In the illustrated embodiment, each CGH is a substantially transparent member that is formed in a silicon optical substrate. Each CGH may be a one-dimensional CGH or a two-dimensional CGH. A one-dimensional CGH is configured to modulate the input beam from source 16 along one axis. In one embodiment, there are eight discrete surface depths per period etched into each one-dimensional CGH along one axis. Each period may be, for example, 30 $\mu$m (micrometers) in length.

The detected optical power output pattern on the detector 18 as a result of using one-dimensional CGHs (with a focusing beam input region with a spiral configuration) is a series of ring-shaped patterns. A $0^{th}$ diffraction order of light propagation from each CGH corresponds to the output beams that are used for data transmissions. A $9^{th}$ diffraction order of light propagation from each CGH corresponds to the light samples that are used for monitoring. In these embodiments, optical power outputs other than the $0^{th}$ diffraction order and the $9^{th}$ diffraction order (i.e., $-9^{th}$ diffraction order to $-1^{st}$ diffraction order and $1^{st}$ diffraction order to $8^{th}$ diffraction order) are suppressed by design and not used.

Additional details regarding the construction and operation of diffractive optical elements 50–56 may be obtained from U.S. patent application Ser. No. 09/738,417, filed Dec. 15, 2000, by Kit M. Cham et al., and entitled "Integrated Parallel Channel Optical Monitoring for Parallel Optics Transmitter."

Figure 4:
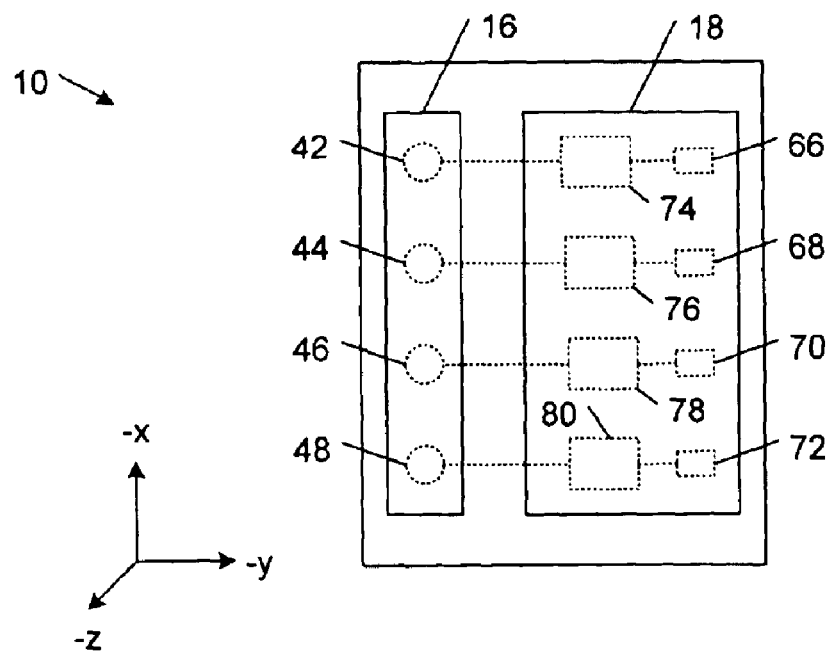
FIG. 4 is a diagrammatic back view of the input light source and the detector mounted to the optical substrate of FIG. 1.

Referring back to FIG. 1 and to FIG. 4, detector 18 is mounted to the device side 30 of optical substrate 14 in alignment for detection of light samples that are transmitted from reflector 22 and through feedback block 12 and optical substrate 14. In general, detector 18 includes a respective light detector for each channel of optical source 16. In the illustrated embodiment, detector 18 includes a 4-channel parallel array of semiconductor light detectors 66, 68, 70, 72 (e.g., photodiodes). As shown in shadow in FIG. 4, each channel also includes a respective feedback control system 74, 76, 78, 80, each of which is operable to adjust the input current driving a corresponding channel light transmitter 42–48. In the illustrated embodiment, feedback control systems 74–80 are integrated with the detectors 66–72 on a common detector device module. In other embodiments, the feedback control systems 74–80 and the detectors 66–72 may be formed on separate device modules.

Figure 5:
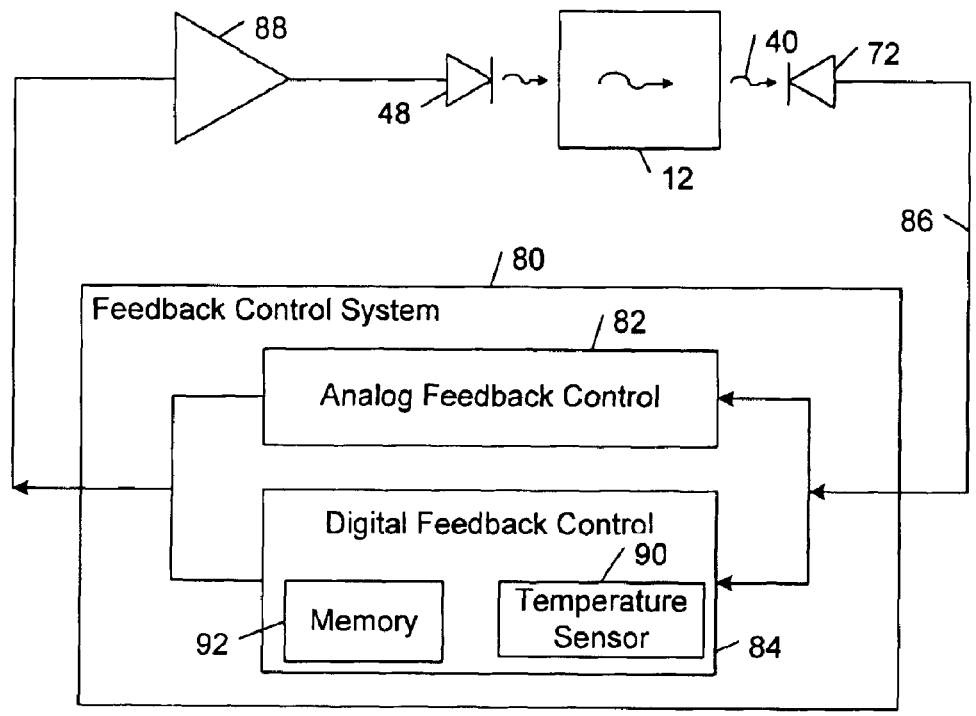
FIG. 5 is a block diagram of a feedback control system coupled between the input light source and the detector of FIG. 1.

FIG. 5 illustrates an embodiment of one optical channel of optical transmitter system 10. Each of the other optical channels may be implemented in the same way. In the illustrated optical channel, each feedback control system 80 includes an analog feedback control 82 and a digital feedback control 84.

Analog feedback control 82 is operable to maintain transmitter 48 at a target optical output power regardless of changes in environmental conditions, such as temperature. In operation, a light sample 40 is detected by detector 72, which generates a feedback signal 86 that is proportional to the light sample optical power. Based on feedback signal 86, analog feedback control 82 adjusts the current driver 88 for transmitter 48. If a drop in optical power output is detected, the analog feedback control 82 will direct driver 88 to increase the input current to transmitter 48. Conversely, if an increase in optical power output is detected, the analog feedback control 82 will direct driver 88 to lower the input current to transmitter 48.

Digital feedback control 84 is operable to adjust the current level driving transmitter 48 based on feedback signal 86 and other information. The current surrounding temperature is measured by a temperature sensor 90. Corresponding to the measured temperature, a memory device 92 (e.g., an EEPROM) provides characteristic data, including optimum power level data and other information, such as the slope efficiency of transmitter 48. If the detected optical power that is below the identified optimum power level at the current temperature, the digital feedback control 84 will direct the driver 88 to increase the input current to transmitter 48. Conversely, if the detected optical power is above the identified optimum power level at the current temperature, the digital feedback control 84 will direct the driver 88 to decrease the input current to transmitter 48.

Figure 6:
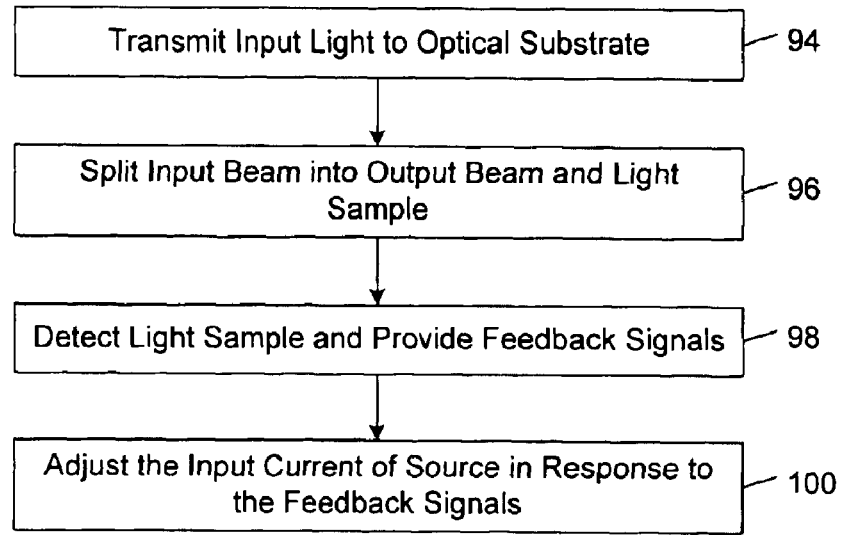
FIG. 6 is a flow diagram of a method of monitoring the input light signals transmitted from the input light source of FIG. 1.

Referring to FIG. 6, in one embodiment, each channel within optical transmitter system 10 may be monitored and controlled as follows. Input light is transmitted by a channel transmitter 42–48 to the optical substrate 14 (step 94). The input light beam is split into an output beam and a light sample beam (step 96). The channel detector 66–72 detects the light sample that is transmitted through feedback block 12 and optical substrate 14 and generates a feedback signal representative of the optical power of the light sample (step 98). The channel feedback control system 74–80 adjusts the input current of the channel transmitter 42–48 based on the feedback signal generated by the channel detector 66–72 (step 100).

Other embodiments are within the scope of the claims.

For example, the embodiments described above include a single reflector 22 for directing light sample 40 to detector 18. Other embodiments may include more than one reflector for directing light samples to detector 18. In some of these embodiments, the optical fiber side 20 of the feedback block 12 may include 1+M reflectors and the optical substrate side 28 of the feedback block 12 may include M reflectors, where M has a value of 0 or greater. In other embodiments, the 1+M individual reflectors on the optical fiber side 20 may be merged into a single reflector and the M reflectors on the optical substrate side 28 may be merged into a single reflector.

Although the above embodiments are described in connection with an optical transmitter system, these embodiments readily may be incorporated into an optical transceiver system that includes an optical signal detector in addition to the input light source 16 and the monitoring detector 18.

What is claimed is:

1. An optical transmitter system, comprising:
    a feedback block substantially transparent to light within an operative wavelength range and including an optical fiber side having a light output and one or more reflectors, and an optical substrate side;
    an optical substrate substantially transparent to light within the operative wavelength range, the optical substrate including a device side having a light input, and a feedback block side coupled to the optical substrate side of the feedback block and having a splitter operable to split light received from the device side light input into an output beam directed toward the light output of the feedback block and a light sample directed toward a feedback block reflector;
    a source of input light within the operative wavelength range mounted to the device side of the optical substrate and aligned for light transmission through the device side light input to the splitter; and
    a detector mounted to the device side of the optical substrate and aligned for detection of the light sample transmitted from a feedback block reflector and through the feedback block and the optical substrate.

2. The system of claim 1, wherein the input light source and the detector are flip-chip bonded to the device side of the optical substrate.

3. The system of claim 1, wherein the splitter is operable to split N light beams, the input light source comprises N light transmitters, and the detector comprises N light detectors, where N has an integer value of 2 or greater.

4. The system of claim 1, wherein the splitter comprises one or more diffractive optical elements.

5. The system of claim 4, wherein each diffractive optical element is operable to pass the output beam and to diffract the light sample.

6. The system of claim 5, wherein the output beam corresponds to a first target diffraction order for data transmissions and the light sample corresponds to a second target diffraction order for monitoring.

7. The system of claim 4, wherein each diffractive optical element is operable to pass the light sample and diffract the output beam.

8. The system of claim 1, wherein the optical fiber side of the feedback block includes 1+M reflectors and the optical substrate side of the feedback block includes M reflectors, where M has a value of 0 or greater.

9. The system of claim 1, wherein each reflector comprises one or more metal layers.

10. The system of claim 1, wherein each reflector comprises a stack of dielectric layers.

11. The system of claim 1, wherein the feedback block and the optical substrate are substantially thermally-matched.

12. The system of claim 1, wherein the optical substrate has a higher refractive index than the feedback block with respect to light within the operative wavelength range.

13. The system of claim 1, wherein the optical substrate is formed of silicon and the feedback block is formed of glass.

14. The system of claim 13, wherein the feedback block is formed of borosilicate glass.

15. The system of claim 13, wherein the operative wavelength range is 1270 nm to 1600 nm.

16. The system of claim 15, wherein the source is operable to generate light with a wavelength of 1310 nm.

17. The system of claim 15, wherein the source is operable to generate light with a wavelength of 1550 nm.

18. The system of claim 1, further comprising a feedback monitoring system coupled between the detector and the input light source and operable to adjust an input current for the input light source based on signals received from the detector.

19. An optical transmitter monitoring method, comprising:

transmitting input light within an operative wavelength range from a source through an optical substrate substantially transparent to light within the operative wavelength range;

splitting the transmitted input light into an output beam directed toward an output of the optical transmitter and a light sample directed toward a target reflector;

respectively transmitting the output beam and the light sample to the output of the optical transmitter and the target reflector through a feedback block substantially transparent to light within the operative wavelength range and having one or more reflectors, including the target reflector; and detecting the light sample transmitted from a feedback block reflector and through the feedback block and the optical substrate.

20. An optical transmitter monitoring method, comprising:

transmitting input light within an operative wavelength range from a source through an optical substrate substantially transparent to light within the operative wavelength range;

splitting the transmitted input light into an output beam directed toward a light output and a light sample directed toward a target reflector;

respectively transmitting the output beam and the light sample to the light output and the target reflector through a feedback block substantially transparent to light within the operative wavelength range and having one or more reflectors, including the target reflector;

detecting the light sample transmitted from a feedback block reflector and through the feedback block and the optical substrate; and generating feedback signals based on the detected light sample and adjusting an input current to the source in response to the generated feedback signals.

21. A method of making an optical transmitter system, comprising:

forming a feedback block substantially transparent to light within an operative wavelength range and including an optical fiber side having a light output and one or more reflectors, and an optical substrate side;

forming an optical substrate substantially transparent to light within the operative wavelength range, the optical substrate including a device side having a light input, and a feedback block side having a splitter operable to split light received from the device side light input into an output beam directed toward the light output of the feedback block and a light sample directed toward a feedback block reflector;

coupling the feedback block side of the optical substrate to the optical substrate side of the feedback block;

flip chip mounting a source of input light within the operative wavelength range to the device side of the optical substrate in alignment for light transmission through the device side light input to the splitter; and flip chip mounting a detector to the device side of the optical substrate in alignment for detection of the light sample transmitted from a feedback block reflector and through the feedback block and the optical substrate.

* * * * *